US008856201B1

(12) United States Patent
Langhammer et al.

(10) Patent No.: US 8,856,201 B1
(45) Date of Patent: Oct. 7, 2014

(54) MIXED-MODE MULTIPLIER USING HARD AND SOFT LOGIC CIRCUITRY

(75) Inventors: Martin Langhammer, Salisbury (GB); Kwan Yee Martin Lee, Hayward, CA (US); Ali H. Burney, Fremont, CA (US)

(73) Assignee: Altera Corporation, San Jose, CA (US)

(*) Notice: Subject to any disclaimer, the term of this patent is extended or adjusted under 35 U.S.C. 154(b) by 387 days.

(21) Appl. No.: 13/447,687

(22) Filed: Apr. 16, 2012

Related U.S. Application Data

(63) Continuation of application No. 10/986,428, filed on Nov. 10, 2004, now abandoned.

(51) Int. Cl.
*G06F 7/523* (2006.01)

(52) U.S. Cl.
USPC .......................................... 708/620

(58) Field of Classification Search
None
See application file for complete search history.

(56) References Cited

U.S. PATENT DOCUMENTS

| | | | |
|---|---|---|---|
| 5,847,981 A | 12/1998 | Kelley et al. | |
| 5,974,435 A * | 10/1999 | Abbott | 708/523 |
| 6,327,605 B2 | 12/2001 | Arakawa et al. | |
| 6,353,843 B1 | 3/2002 | Chehrazi et al. | |
| 6,369,610 B1 | 4/2002 | Cheung et al. | |
| 6,434,587 B1 | 8/2002 | Liao et al. | |
| 6,487,575 B1 | 11/2002 | Oberman | |
| 6,538,470 B1 | 3/2003 | Langhammer et al. | |
| 6,763,367 B2 | 7/2004 | Kwon et al. | |
| 7,107,305 B2 | 9/2006 | Deng et al. | |
| 7,181,484 B2 | 2/2007 | Stribaek et al. | |
| 7,313,585 B2 | 12/2007 | Winterrowd | |
| 2001/0023425 A1 | 9/2001 | Oberman et al. | |
| 2002/0089348 A1 | 7/2002 | Langhammer | |
| 2004/0148321 A1 | 7/2004 | Guevorkian et al. | |
| 2004/0267863 A1 | 12/2004 | Bhushan et al. | |
| 2005/0257030 A1 | 11/2005 | Langhammer | |
| 2006/0230094 A1 * | 10/2006 | Simkins et al. | 708/625 |

* cited by examiner

*Primary Examiner* — David H Malzahn
(74) *Attorney, Agent, or Firm* — Ropes & Gray LLP; Jeffrey H. Ingerman

(57) ABSTRACT

Multiplier circuitry that efficiently utilizes the hard and soft logic regions of a programmable logic device (PLD) is provided. The multiplier circuitry includes a partial product generation block, a compression block (e.g., a carry-save adder), and an carry-propagate adder stage. The partial product generation and compression block are implemented in hard logic while the carry-propagate adder is implemented in soft logic. Local or global routing may be used to connect the hard and soft multiplier components. The multiplier may further include a selectable input register in hard logic and/or a selectable output register in soft logic. This mixed-mode design allows for a substantial savings in the amount of hard logic required to implement the multiplier without a significant decrease in multiplier performance.

16 Claims, 3 Drawing Sheets

MIXED-MODE MULTIPLIER USING HARD AND SOFT LOGIC CIRCUITRY

CROSS REFERENCE TO RELATED APPLICATION

This is a continuation of copending, commonly-assigned U.S. patent application Ser. No. 10/986,428, filed Nov. 10, 2004, which is hereby incorporated by reference herein in its entirety.

BACKGROUND OF THE INVENTION

This invention relates generally to multiplier circuitry. In particular, this invention relates to a multiplier design that uses hard and soft logic in a programmable logic device in order to reduce the dedicated die area required for the multiplier. This design reduces the amount of dedicated die without using the soft logic inefficiently or producing a significant decrease in the performance of the multiplier.

Programmable logic devices (PLDs) include generalized logic circuitry such as look-up tables (LUTs) and sum-of-product based logic that are designed to allow a user to customize the circuitry to the user's particular needs. This configurable logic is typically divided into individual logic circuits that are referred to as logic elements (LEs). As an example, each LE in a PLD may be configured as a 4-input LUT. The LEs may be grouped together to form larger logic blocks referred to as logic array blocks (LABs) that may be configured to share the same resources (e.g., registers and memory). In addition to this configurable logic, PLDs also include programmable interconnect or routing circuitry that is used to connect the inputs and outputs of the LEs and LABs. The combination of this programmable logic and routing circuitry is referred to as soft logic.

Besides soft logic, PLDs may also include hard logic circuitry that implements specific predefined logic functions and thus cannot be configured by the user. One common type of functional circuitry that is implemented in hard logic in PLDs is a multiplier. Multipliers are intensively used in applications such as digital signal processing (DSP), for example. Currently, multipliers that are implemented using hard logic are implemented virtually exclusively in hard logic. Although soft logic may be used to combine several hard multipliers together to form a larger multiplier, none of the existing multiplier implementations divide the multiplier components (e.g., adder stages) that are responsible for performing the multiplication operation into portions that are implemented in hard logic and portions that are implemented in soft logic. The problem with providing multipliers and other types of hard logic circuitry on devices such as PLDs is that it increases the cost of the devices because of the of dedicated die area that is required to implement such circuitry. On the other hand, multipliers that are designed purely in soft logic often make inefficient use of the logic and routing resources and perform slower than equivalent hard logic multipliers. For example, the use of soft logic to perform partial product generation usually requires an excessive amount of LUTs and interconnect resources. For other common multiplier functions such as carry-save addition, the LUTs used for this function are not fully used and thus waste logic and routing. If an adder tree is used as an alternative to carry save addition, then fitting the design to the soft logic architecture can become an issue.

Thus, it would be desirable to create a multiplier design, in a device such as a PLD that uses includes hard and soft logic, that reduces the amount of dedicated die area required for the multiplier. It would be further desirable to design a multiplier using hard and soft logic that reduces the amount of required hard logic without inefficiently using the soft logic. It would be still further desirable to design a multiplier using hard and soft logic that reduces the amount of required hard logic without a significant decrease in the performance of the multiplier.

SUMMARY OF THE INVENTION

According to the present invention, a mixed-mode multiplier design that includes soft (i.e., configurable) logic and hard (i.e., non-configurable) logic regions is provided. The multiplier includes a partial product generation (PPG) block, a compression block (e.g., a carry-save adder (CSA)), and a final adder stage (e.g., a carry propagate adder (CPA)). The multiplier may also include a selectable input register and a selectable output register. The selectable input register, PPG, and compression block are implemented in hard logic, while the adder and selectable output register are implemented in soft logic. The output of the hard logic components of the multiplier may be connected to the soft logic components via local routing dedicated to the multiplier. Alternatively, the interface between the hard and soft multiplier components may be provided by global routing that is available for general use by the multiplier as well as other circuitry on the device. In addition, the adder and selectable output register may be implemented using the same LABs or equivalent soft logic structures. Since the final multiplier output stage is generated using soft logic, the output interface (e.g., multiplexer circuitry) that connects the multiplier output lines to global and/or local routing is also implemented in soft logic.

The mixed-mode multiplier design efficiently uses soft logic while realizing a substantial savings in dedicated die area (e.g., for an 18×18-bit multiplier implementation, the mixed-mode design uses approximately 70% of the amount of dedicated die that is used in a pure hard logic multiplier) and little decrease in performance. Furthermore, the port densities of the hard and soft logic multiplier components are similar, thus providing a routing-efficient interface between the two types of multiplier logic.

DETAILED DESCRIPTION OF THE PREFERRED EMBODIMENTS

Figure 1:
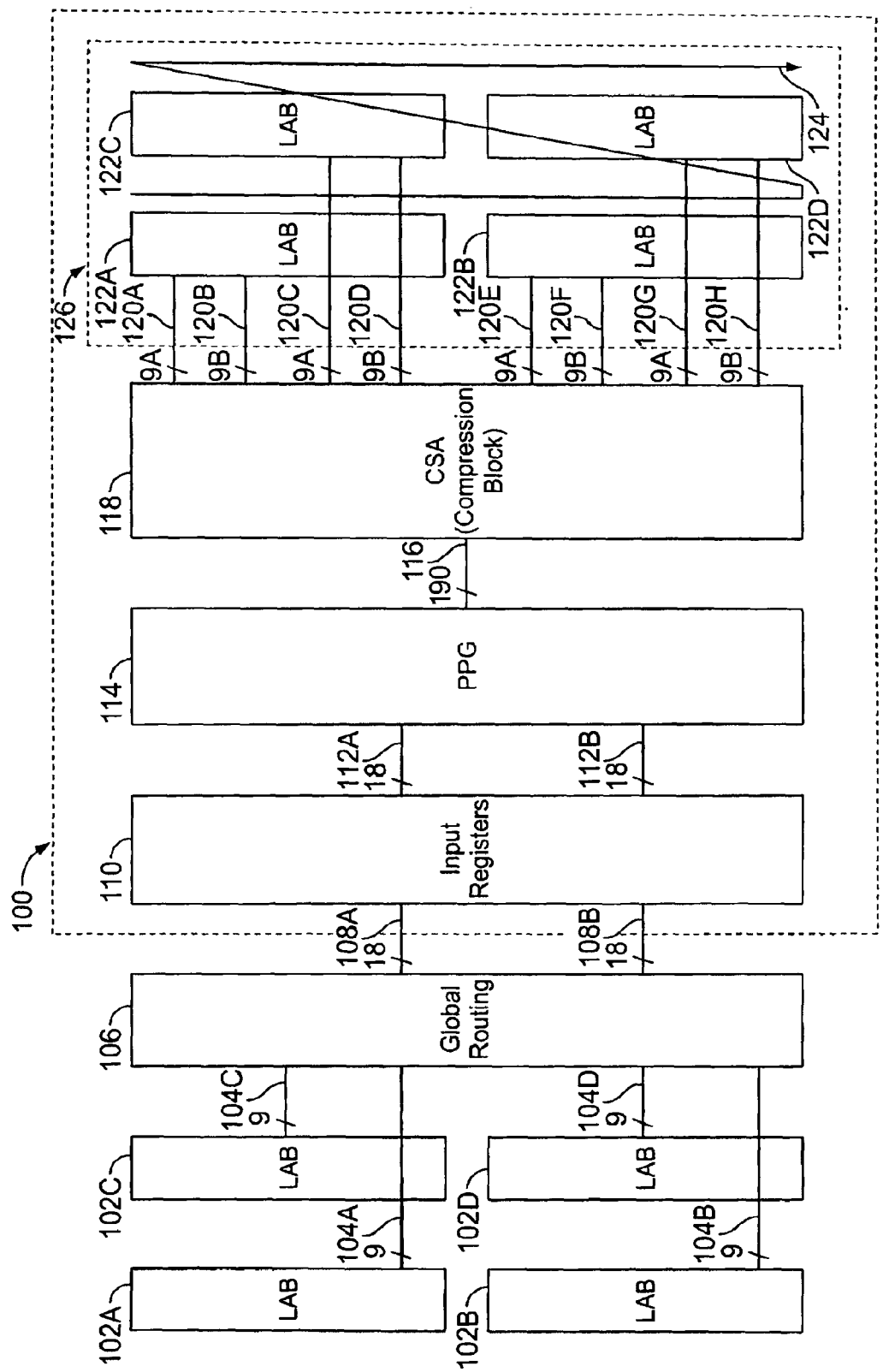
FIG. 1 is a simplified block diagram of an illustrative embodiment of a multiplier in accordance with the present invention.

FIG. 1 shows an illustrative embodiment of a multiplier 100 with a mixed-mode architecture and implemented in a programmable logic device. For purposes of illustration, multiplier 100 is shown to be configured to multiply two 18-bit input terms (i.e., perform 18×18-bit multiplication). Nevertheless, it will be understood that the multiplier can be scaled to support the multiplication of larger or smaller input terms.

Multiplier 100 includes input registers 110, PPG block 114, CSA 118 and CPA 126. The inputs to multiplier 100 are provided by LABs 102A-D. In this illustration, LABs 102A-D each provide 9 bits of output to multiplier 100. As a result, four LABs are required in order to feed the 36 bits of inputs to multiplier 100 to perform 18×18-bit multiplication. A fewer or greater number of LABs may in practice be used to provide the inputs to multiplier 100, depending on the number of bits that each LAB is configured to provide and the size of multiplier 100. Furthermore, the arrangement of the input LABs 102A-D is merely illustrative, as they may be physically arranged in alternative configurations relative to each other and to multiplier 100.

In general, the inputs to multiplier 100 may be routed from global or local routing on the PLD. As previously mentioned, global routing is not specific to the multiplier and can be used by other types of circuitry on the PLD including LABs, DSP circuitry, and I/O circuitry. On the other hand, local routing is dedicated to the multiplier, in that it provides routing that is designed for and used exclusively by the multiplier. In FIG. 1, the outputs of LABs 102A-D are transmitted to global routing 106 via local interconnect lines 104A-D. In particular, lines 104A-D are muxed with global interconnect lines (not shown) in global routing 106. Global routing 106 then routes the multiplier input signals to a region closer in proximity to multiplier 100 and demuxes the signals onto local interconnect lines 108A and 108B that are subsequently transmitted to input registers 110.

Input registers 110, which are implemented in hard logic, register the two inputs to multiplier 100 before passing the 18-bit inputs to PPG block 114 via lines 112A and 112B. It should also be mentioned that input registers 110 typically include associated bypass circuitry (e.g., input registers 110 may be followed by bypass multiplexers (not shown)) and are thus selectable (i.e., the registers may be selectively bypassed). For example, when the inputs are transmitted to the multiplier from other LABs (i.e., soft logic), it may be unnecessary to use the input registers since the inputs may be stored in the output registers of those LABs before being transmitted to the multiplier (without violating register timing constraints since the delay of the inputs through the local routing is negligible).

PPG block 114, which is also implemented in hard logic, generates all the partial product terms for performing the multiplication of the two input terms, which consist of a multiplicand and a multiplier. Generally speaking, PPG block 114 performs bit-wise multiplication on each of the multiplier bits with each of the bits of the multiplicand. This may be achieved using any of a variety of common techniques that include a Booth or modified-Booth approach, or even simply the use of a plurality AND gates. The partial product terms generated by PPG block 114 are subsequently passed on to CSA 118 via lines 116.

Like PPG block 114, CSA 118 is also implemented in hard logic. CSA 118 compresses the partial product terms generated by PPG block 114 in order to reduce the number of terms that need to be added by CPA 126. In the embodiment of the invention illustrated in FIG. 1, CSA 118 is configured as a Wallace tree (that may be constructed using multiple cascaded layers of 3-bit full adders) that efficiently reduces the plurality of partial product terms to two compressed vectors, a first 36-bit vector corresponding to the sum of only the bits in the partial product terms (i.e., a "summation term"), without generating carry bits, and a second 36-bit vector corresponding to the sum of the carry bits generated by the summation of the partial product terms (i.e., a "carry term"). Alternatively, CSA 118 may be substituted with other types of compression logic (e.g., other adder trees) implemented in hard logic that reduces the number of terms that need to be added. The outputs of CSA 118 are fed to CPA 126 via lines 120A-H.

CPA 126 is implemented in soft logic. In the embodiment shown, lines 120A-H connecting the hard logic CSA 118 to the soft logic CPA 126 represent local routing lines. Alternatively, global routing lines may be used to transmit the output of CSA 118 to CPA 126 (e.g., if the hard and soft logic portions of multiplier 100 are distant from each other). One advantage of transmitting the output of CSA 118 to CPA 126 via local rather than global routing is that it tends to consume less die area and may result in faster operation. However, configuring the LABs to receive input signals via local routing may complicate the general LAB design because they must be still configured to receive signals via global routing (i.e., from distant logic). On the other hand, if the inputs to CPA 126 were transmitted from CSA 118 via global routing, this design would make it possible to implement a simple LAB architecture in which all the inputs to the LABs were provided from global routing or at least from general-purpose routing.

In terms of operation, CPA 126 performs the addition of the terms output by CSA 118 to generate the final multiplier product term. In FIG. 1, CPA 126 includes four separate LABs 122A-D that are arranged in two columns of LABs, each two LABs high. The advantage of this embodiment is that PPG block 114 and CSA 118 are each also two LABs high, and thus keeping CPA 108 two LABs high preferably maintains a rectangular layout for the overall multiplier. Each of LABs 122A-D receives as input two 9-bit words and is accordingly configured as a 9-bit ripple-carry adder. Thus, four LABs are required in this example to add the two 36-bit summation and carry vectors from CSA 118. Arrow 124 indicates the order of significance of the input terms from least to greatest. It will be understood that LABs 122A-D shown here to form CPA 126 are merely illustrative, and that a greater or fewer number of LABs or equivalent soft-logic components may in actuality be used to form the final adder stage of the mixed-mode multiplier without departing from the scope of the invention. Factors that inevitably determine the number of LABs that are required to form CPA 108 include the number and size of the vectors generated by the carry-save adder as well as the specific parameters (e.g., number of LEs per LAB, size of each LE) of the LABs. The multiplier output product term that is generated by CPA 126 may be output to global or local routing depending on distance from the LAB to the intended destination and the LAB design. Alternatively, CPA 126 may be configured as another type of adder stage (e.g., a carry-lookahead or carry-select adder) or comparable accumulator structure that may be efficiently implemented in soft logic and used accordingly to perform addition of the output terms from CSA 118. The output product term computed by CPA 126 may be muxed with either global or local routing lines for output. The product generated by LABs 122A-D may be stored in a selectable output register of the LABs (e.g., a flip-flop) before being transmitted in order to pipeline the output.

Figure 2:
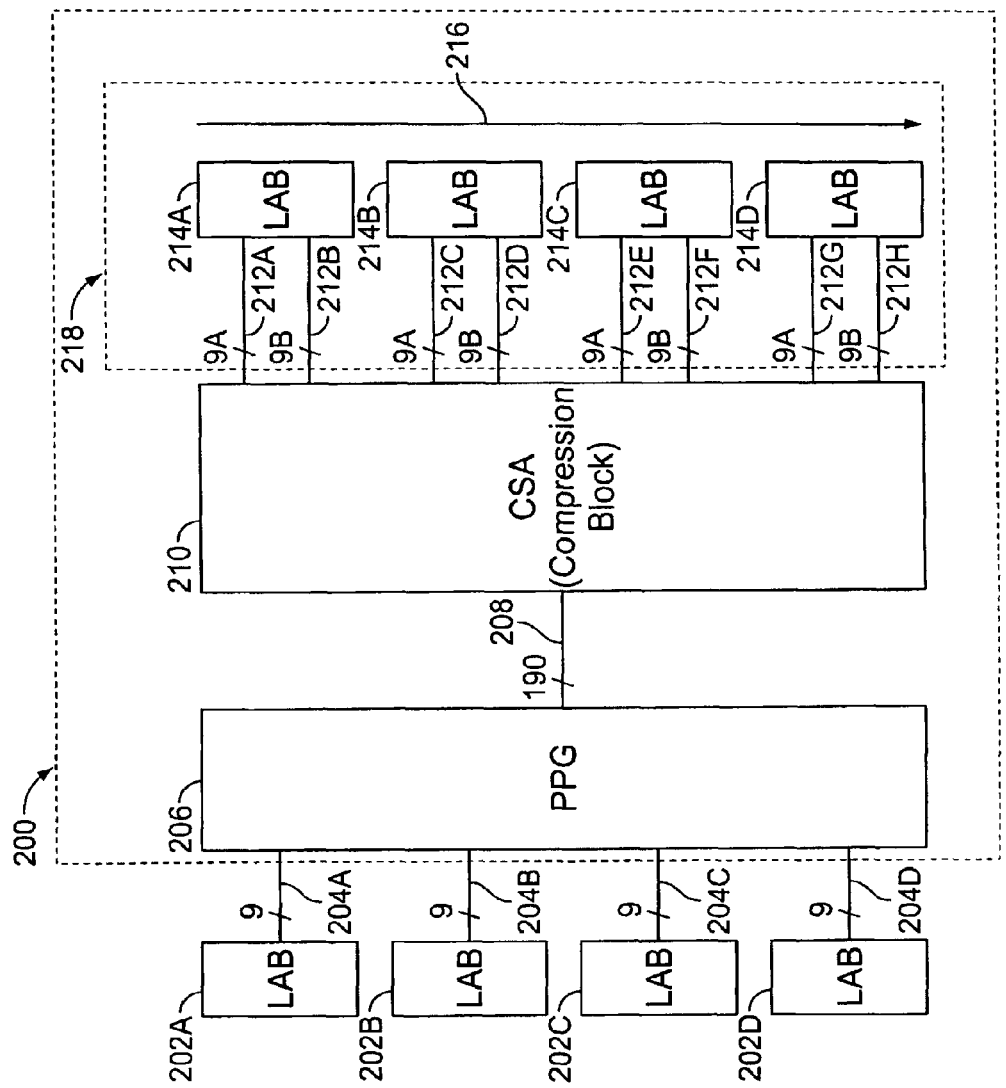
FIG. 2 is another simplified block diagram of an illustrative embodiment of multiplier circuitry in accordance with the present invention.

FIG. 2 shows an alternative multiplier 200 of the present invention. Multiplier 200 is similar to multiplier 100 of FIG. 1, the only notable differences being that the inputs to multiplier 200 are provided directly by local LABs 202A-D via local interconnect lines 204A-D, and that the layout of multiplier 200 is four LAB units high rather than two. In FIG. 2, the input registers to multiplier 200 have been removed from the design (thereby further reducing the size of multiplier), as would be the case if, for example, the inputs were provided by LABs that registered the signals prior to transmitting them to multiplier 200 as previously explained. Alternatively, similar to multiplier 100, multiplier 200 may also include input registers that may be selectively bypassed. Furthermore, since the layout of multiplier 200 is four LABs high, multiplier 200 may be easier to implement and as a result operate faster than multiplier 100 because the height of the multiplier matches the number of LABs with which it interfaces, thereby eliminating any routing inefficiencies. It is thus seen that the arrangement of the LABs (e.g., 2×2, as in the embodiment shown in FIG. 1; 4×1, as in the embodiment shown in FIG. 2; or 1×4)—and as a result the height of the multiplier—may be altered without departing from the scope of the present invention.

Since multiplier 200 operates substantially in the same manner as multiplier 100, the operation of multiplier 200 will only be briefly described, with the understanding that the description of the operation and different embodiments of multiplier 100 are also applicable to multiplier 200. Inputs to multiplier 200 are transmitted from local LABs 202A-D via local interconnect lines 204A-D to PPG block 206, implemented in hard logic. PPG block generates the partial product terms (190 bits for 18×18-bit multiplication) and outputs the partial products to CSA 210, which is also implemented in hard logic. CSA 210 reduces the partial products to two 36-bit vectors corresponding to a summation term and a carry term. These components are transmitted via local routing lines 212A-H to soft logic CPA 218, which includes LABs 214A-D. CPA 218 adds together the vectors generated by CSA 210 to generate the final product term for output.

Figure 3:
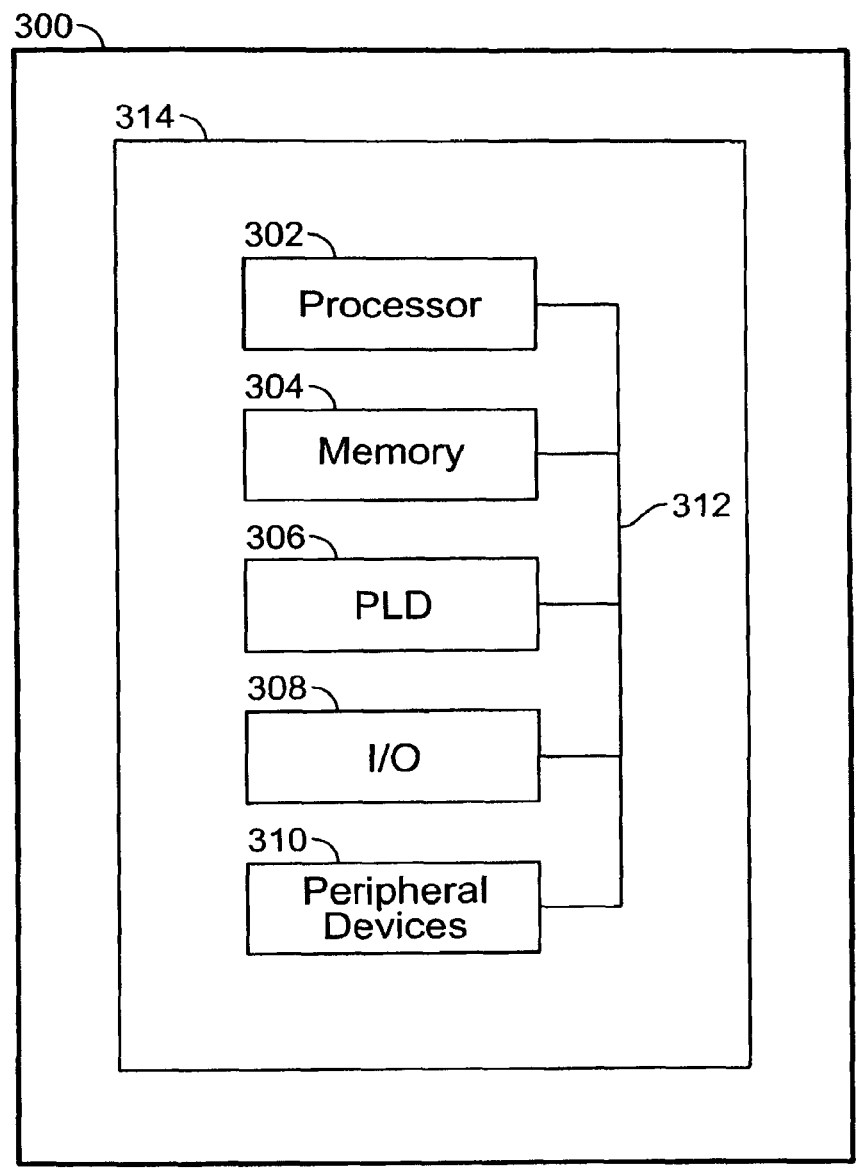
FIG. 3 is a simplified block diagram of an illustrative system employing multiplier circuitry in accordance with the present invention.

FIG. 3 illustrates a PLD 306 that utilizes a multiplier in accordance with the present invention and that is part of an end-user data processing system 300. Data processing system 300 may include one or more of the following components: a processor 302; memory 304; I/O circuitry 308; and peripheral devices 310. These components are coupled together by a system bus 312 and are populated on a circuit board 314 which is contained in system 300.

System 300 can be used in a wide variety of applications, such as computer networking, data networking, instrumentation, video processing, digital signal processing, or any other application where the advantage of using programmable logic is desirable. PLD 306 can be used to perform a variety of different logic functions. For example, PLD 306 can be configured as a processor or controller that works in cooperation with processor 302. In yet another example, PLD 306 can be configured as an interface between processor 302 and one of the other components in system 300.

It will be understood, therefore, that the foregoing is only illustrative of the principles of the invention, and that various modifications can be made by those skilled in the art without departing from the scope and spirit of the invention, and that the present invention is limited only by the claims that follow.

What is claimed is:

1. A programmable device comprising:
an array of user-configurable logic regions arranged in rows and columns, each of said user-configurable logic regions having a first height dimension;
at least one non-configurable logic region located within said array and being preconfigured to perform at least one, and fewer than all, functions needed to perform a multiplication operation, each said at least one non-configurable logic region having a second height dimension equal to an integral number of said first height dimension; and
a network of user-configurable interconnection conductors for conveying signals to, from and among said logic regions; wherein:
additional functions needed, with said functions performed by said non-configurable logic region, to perform a multiplication operation, are configurable using a particular number of said user-configurable logic regions; and
said second height dimension is designed so that said integral number is equal to said particular number; whereby:
one of said at least one non-configurable logic region, together with a group of said user-configurable logic regions adjacent to said one of said at least one non-configurable logic region, said group being of said particular number, are configurable, using said network of interconnection conductors, to perform a multiplication operation in a substantially rectangular portion of said programmable device.

2. The programmable device of claim 1 wherein said at least one non-configurable logic region is coupled to said particular number of said user-configurable logic regions by global routing.

3. The programmable device of claim 1 wherein said at least one non-configurable logic region is coupled to said particular number of said user-configurable logic regions by local routing.

4. The programmable device of claim 1 wherein:
said substantially rectangular portion has a height dimension; and
said height dimension is determined by a number of user-configurable logic regions that are required to generate inputs to said multiplication operation.

5. The programmable device of claim 1 wherein:
said at least one non-configurable logic region comprises circuitry that is operative to generate partial product terms, the sum of which is the product of the multiplication operation component.

6. The programmable device of claim 5 wherein said at least one non-configurable logic region further comprises circuitry that is operative to compress the partial product terms to generate at least two compressed vectors.

7. The programmable device of claim 6 wherein the circuitry that is operative to compress the partial product terms to generate at least two compressed vectors comprises a carry-save adder.

8. The programmable device of claim 7 wherein the carry-save adder is arranged in a Wallace tree configuration.

9. The programmable device of claim 6 wherein a group of at least one of said user-configurable logic regions is configured as circuitry operative to generate an output product term based on the at least two compressed vectors.

10. The programmable device of claim 9 wherein the circuitry that is operative to generate the output product term based on the at least two compressed vectors comprises a carry-propagate adder.

11. A method of configuring a multiplication operation in a programmable device, said programmable device having an array of user-configurable logic regions arranged in rows and columns, each of said user-configurable logic regions having a first height dimension; at least one non-configurable logic region located within said array and being preconfigured to perform at least one, and fewer than all, functions needed to perform a multiplication operation, each said at least one non-configurable logic region having a second height dimension equal to an integral multiple of said first height dimension; and a network of user-configurable interconnection conductors for conveying signals to, from and among said logic regions; said method comprising:
selecting a group of said user-configurable logic regions adjacent to one of said at least one non-configurable logic region, said group being of a number corresponding to said integral multiple;

configuring said group of user-configurable logic regions to perform additional functions needed, in addition to said functions performed by said non-configurable logic region, to perform a multiplication operation; and configuring said network of interconnection conductors to interconnect said group of user-configurable logic regions and said one of said at least one non-configurable logic region to perform a multiplication operation in a substantially rectangular portion of said programmable device.

12. The method of claim 11 wherein said configuring said network of interconnection conductors comprises coupling said at least one non-configurable logic region to said group of said user-configurable logic regions by global routing.

13. The method of claim 11 wherein said configuring said network of interconnection conductors comprises coupling said at least one non-configurable logic region to said group of said user-configurable logic regions by local routing.

14. The method of claim 11 wherein:
said substantially rectangular portion has a height dimension; and
said height dimension is determined by a number of user-configurable logic regions that are required to generate inputs to said multiplication operation.

15. The method of claim 11 wherein:
said at least one non-configurable logic region comprises circuitry that is operative to generate partial product terms, the sum of which is the product of the multiplication operation component, and circuitry that is operative to compress the partial product terms to generate at least two compressed vectors; and
said configuring said group of user-configurable logic regions to perform additional functions needed comprises configuring circuitry that is operative to generate an output product term based on the at least two compressed vectors.

16. The method of claim 15 wherein configuring circuitry that is operative to generate an output product term based on the at least two compressed vectors comprises configuring at least a portion of said group of user-configurable logic regions as a carry-propagate adder.

* * * * *